United States Patent [19]
Saitoh

[11] Patent Number: 5,872,465
[45] Date of Patent: Feb. 16, 1999

[54] SELF CUT-OFF TYPE SENSE AMPLIFIER OPERABLE OVER A WIDE RANGE OF POWER SUPPLY VOLTAGES

[75] Inventor: Toshio Saitoh, Tokyo, Japan

[73] Assignee: NEC Corporation, Tokyo, Japan

[21] Appl. No.: 917,883

[22] Filed: Aug. 27, 1997

[30] Foreign Application Priority Data

Aug. 28, 1996 [JP] Japan .................................. 8-227004

[51] Int. Cl.$^6$ ....................................................... G11C 7/06
[52] U.S. Cl. ............................................. 327/54; 327/51
[58] Field of Search .................. 327/51–56; 365/185.21, 365/189.05

[56] References Cited

U.S. PATENT DOCUMENTS

| 5,155,397 | 10/1992 | Fassino et al. ............................. 327/54 |
| 5,329,494 | 7/1994 | Suzuki et al. ....................... 365/230.03 |
| 5,434,824 | 7/1995 | Matsuzaki ............................. 365/233.5 |
| 5,479,374 | 12/1995 | Kobayashi et al. .................... 365/233.5 |
| 5,729,499 | 3/1998 | Fujiwara et al. ..................... 365/189.05 |
| 5,742,549 | 4/1998 | Ochoa et al. .............................. 327/57 |

FOREIGN PATENT DOCUMENTS 0435 581 A2  7/1991  European Pat. Off. .......... G11C 7/06

*Primary Examiner*—Toan Tran
*Attorney, Agent, or Firm*—Whitham, Curtis & Whitham

[57] ABSTRACT

In a sense amplifier including an amplifier circuit for amplifying a difference in potential between data lines, an amplifier circuit activating circuit for receiving a sense start signal to activate the amplifier circuit and receiving a sense end signal to deactivate said amplifier circuit, a first sense detecting circuit for determining whether or not the amplifier circuit is activated in accordance with a first output voltage thereof and generating a first sense detection signal, a second sense detecting circuit for determining whether or not the amplifier circuit is activated in accordance with a second output voltage thereof and generating a second sense detection signal, and a sense end signal generating circuit for receiving at least one of the first and second sense detection signals and generating the sense end signal when a predetermined time has passed after at least one of the first and second sense detection signals is received, a masking circuit is connected between the first and second sense detecting circuits and the sense end signal generating circuit, and prohibits transmission of the first and second sense detection signals to the sense end signal generating circuit only when the first and second sense detection signals are both generated.

7 Claims, 8 Drawing Sheets

Fig. 5 FROM COLUMN SELECTOR 5

5,872,465

SELF CUT-OFF TYPE SENSE AMPLIFIER OPERABLE OVER A WIDE RANGE OF POWER SUPPLY VOLTAGES

BACKGROUND OF THE INVENTION

1. Field of the Invention

The present invention relates to a sense amplifier, and more particularly, to a self cut-off type sense amplifier for a static random access memory (SRAM) device.

2. Description of the Related Art

Generally, in an SRAM device, after a precharging operation is carried out, complementary data is read from a selected memory cell and is sensed by a sense amplifier. The power dissipation of SRAM devices is mainly determined by the precharging operation and the operation of the sense amplifier.

In order to reduce the power dissipation by the operation of the sense amplifier, self cut-off type sense amplifiers have been developed.

A prior art self cut-off type sense amplifier includes an amplifier circuit for amplifying a difference in potential between first and second data lines, an amplifier circuit activating circuit for receiving a sense start signal to activate the amplifier circuit and receiving a sense end signal to deactivate the amplifier circuit, a first sense detecting circuit for determining whether or not the amplifier circuit is activated in accordance with a first output voltage thereof and generating a first sense detection signal, a second sense detecting circuit for determining whether or not the amplifier circuit is activated in accordance with a second output voltage thereof and generating a second sense detection signal, and a sense end signal generating circuit for receiving at least one of the first and second sense detection signals and generating the sense end signal when a predetermined time has passed after at least one of the first and second sense detection signals is received. Thus, since the amplifier circuit is automatically deactivated after a read operation is completed, the power dissipation can be reduced. This will be explained later in detail.

In the above-mentioned prior art self cut-off sense amplifier, however, when a power supply voltage applied to the sense amplifier is reduced, the timing of deactivating the amplifier circuit is advanced, and at worst, the amplifier circuit is deactivated before output data is established. Also, this means that the power supply voltage of SRAM devices having such a self cut-off type sense amplifier is limited.

SUMMARY OF THE INVENTION

It is an object of the present invention to provide a self cut-off sense amplifier operable over a wide range of power supply voltages.

According to the present invention, in a self cut-off type sense amplifier which includes an amplifier circuit for amplifying a difference in potential between first and second data lines, an amplifier circuit activating circuit for receiving a sense start signal to activate the amplifier circuit and receiving a sense end signal to deactivate the amplifier circuit, a first sense detecting circuit for determining whether or not the amplifier circuit is activated in accordance with a first output voltage thereof and generating a first sense detection signal, a second sense detecting circuit for determining whether or not the amplifier circuit is activated in accordance with a second output voltage thereof and generating a second sense detection signal, and a sense end signal generating circuit for receiving at least one of the first and second sense detection signals and generating the sense end signal when a predetermined time has passed after the at least one of the first and second sense detection signals is received, a masking circuit is connected between the first and second sense detecting circuits and the sense end signal generating circuit, and prohibits transmission of the first and second sense detection signals to the sense end signal generating circuit only when the first and second sense detection signals are both generated.

Thus, when the power supply voltage is reduced, the masking circuit delays the sense end signal, so that the timing of deactivating the amplifier circuit is after the timing of establishing output data.

BRIEF DESCRIPTION OF THE DRAWINGS

The present invention will be more clearly understood from the description as set forth below, in comparison with the prior art, with reference to the accompanying drawings, wherein.

DESCRIPTION OF THE PREFERRED EMBODIMENTS

Before the description of the preferred embodiments, a prior art sense amplifier will be explained with reference to FIGS. 1, 2, 3 and 4.

Figure 1:
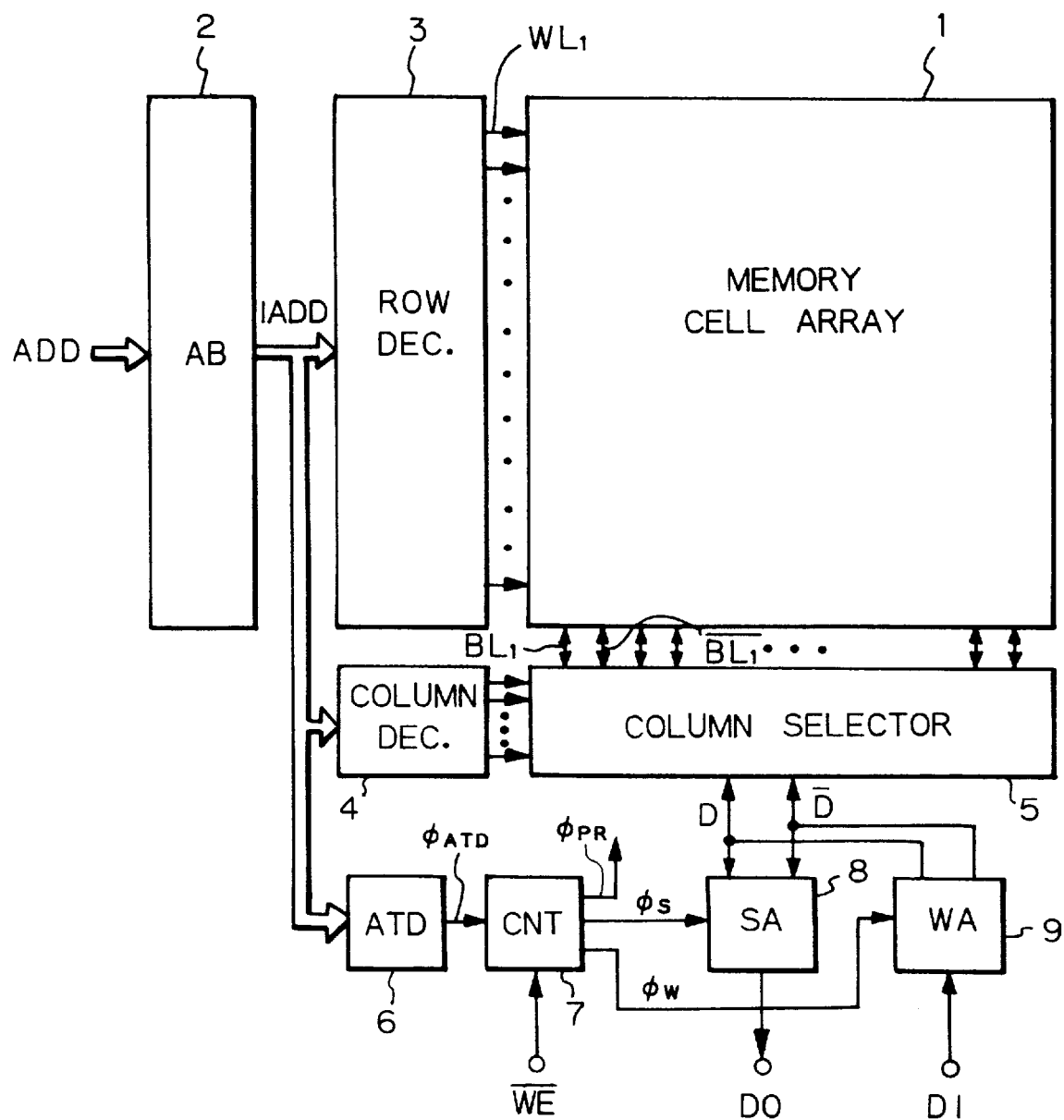
FIG. 1 is a block circuit diagram illustrating a prior art SRAM device.

In FIG. 1, which illustrates a prior art SRAM device, reference numeral 1 designates a memory cell array including memory cells (not shown) at intersections between word lines such as WL1 and bit line pairs such as $BL_1$ and $\overline{BL_1}$. Also, an address buffer 2 receives an external address ADD and generates an internal address IADD. An X component of the internal address IADD is supplied to a row decoder 3 for selecting one of the word lines, and a Y component of the internal address IADD is supplied to a column decoder 4, so that a column selector 5 selects one pair of the bit line pairs. Thus, one memory cell is accessed.

Further, the internal address IADD is supplied to an address transition detection (ATD) circuit 6 for detecting a transition of the internal address IADD to generate an ATD signal $\phi_{ATD}$.

A control circuit 7 receives the ATD signal $\phi_{ATD}$ as well as an inverted signal of a write enable signal WE to generate a precharging signal $\phi_{PR}$ a sense activation signal $\phi_S$ and a write activation signal $\phi_W$. Note that the precharging signal $\phi_{PR}$ is supplied to precharging transistors connected to the bit lines, thus precharging the bit lines. Alao, the sense activation signal $\phi_S$ is supplied as a sense start signal to a sense amplifier 8, thus activating the sense amplifier 8. Further, the write activation signal $\phi_W$ is supplied to a write amplifier 9, thus activating the write amplifier 9.

In a write mode ($\overline{WE}$="0"), the precharging signal $\phi_{PR}$ is generated from the control circuit 7 in synchronization with the ATD signal $\phi_{ATD}$, and thereafter, one memory cell is selected by the row decoder 3 and the column decoder 4 using the internal address IADD. In this state, since the write activation signal $\phi_W$ is also generated from the control circuit 7, the write amplifier circuit 9 is activated, so that potentials at data lines D and $\overline{D}$ are changed in accordance with input data DI, and the potentials are written into the selected memory cell.

On the other hand, in a read mode ($\overline{WE}$="1"), the precharging signal $\phi_{PR}$ is also generated from the control circuit 7 in synchronization with the ATD signal $\phi_{ATD}$, and thereafter, one memory cell is selected by the row decoder 3 and the column decoder 4 using the internal address IADD. As a result, potentials at the data lines D and $\overline{D}$ are changed in accordance with data in the selected memory cell. In this state, since the sense activation signal $\phi_S$ is also generated from the control circuit 7, the sense amplifier 8 is activated, so that the potentials at the data lines D and $\overline{D}$ are amplified, thus obtaining output data DO.

Figure 2:
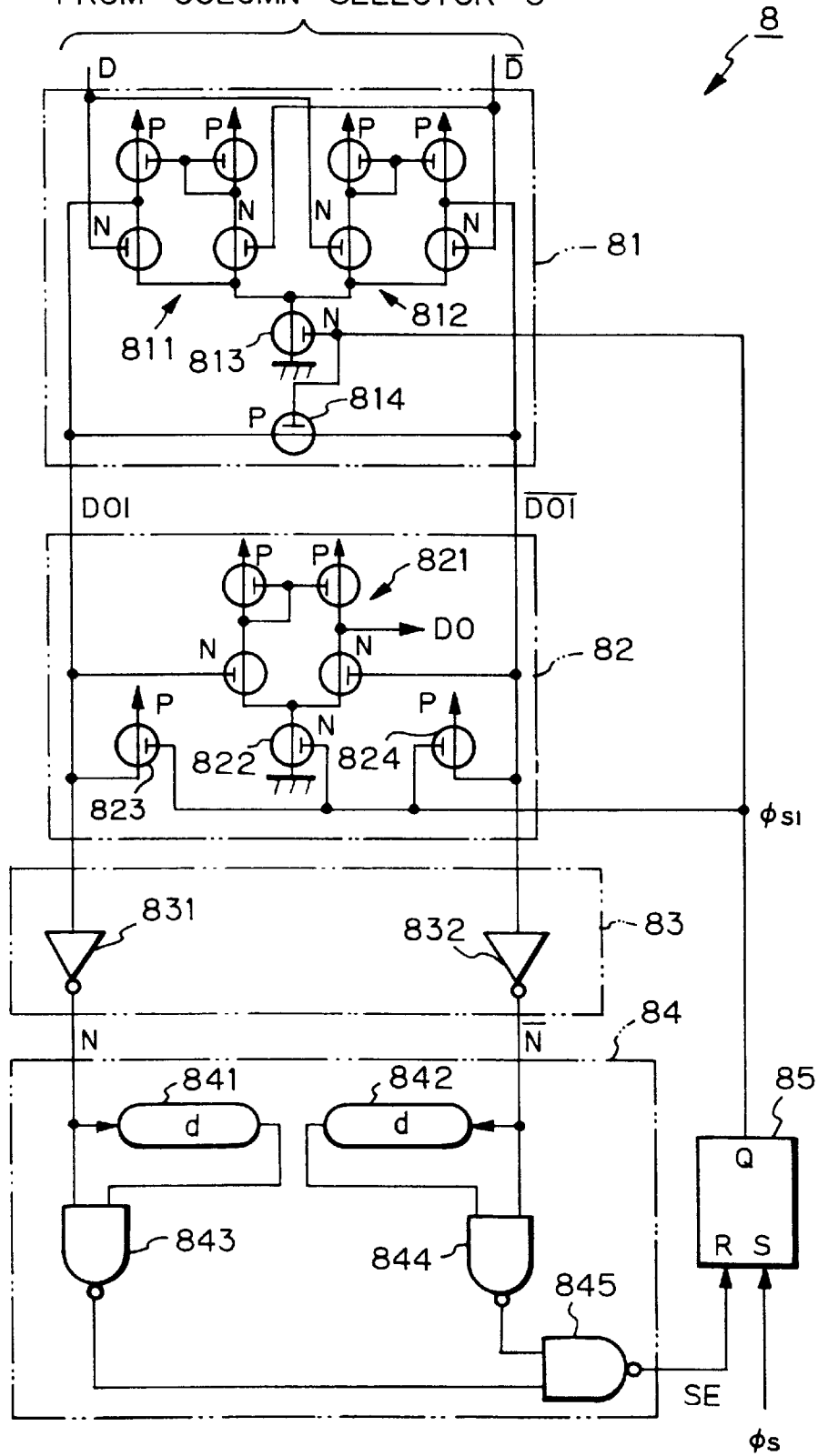
FIG. 2 is a detailed circuit diagram of the sense amplifier of FIG. 1.

In FIG. 2, which is a detailed circuit diagram of the sense amplifier of FIG. 1, two stages of amplifier circuits 81 and 82, a sense detection circuit 83, a sense end signal generating circuit 84, and an internal sense activation signal generating circuit 85 for activating and deactivating the sense amplifier circuits 81 and 82 are provided.

The amplifier circuit 81 is of a two end type which amplifies the potentials at the data lines D and $\overline{D}$ and generates potentials at data lines DOI and $\overline{DOI}$. In more detail, the amplifier circuit 81 is formed by a current mirror circuit 811 for receiving the potentials at the data lines D and $\overline{D}$, a current mirror circuit 812 for receiving the potentials at the data lines $\overline{D}$ and D, an N-channel MOS transistor 813 for turning ON and OFF the current mirror circuits 811 and 812, and a P-channel MOS transistor 814 for equalizing the potentials at the data lines D and $\overline{D}$.

The amplifier circuit 82 is of a single end type which amplifies the potentials at the data lines DOI and $\overline{DOI}$ and generates the output data DO. In more detail, the amplifier circuit 82 is formed by a current mirror circuit 821 for receiving the potentials at the data lines DOI and $\overline{DOI}$, an N-channel MOS transistor 822 for turning ON and OFF the current mirror circuit 821, and P-channel MOS transistors 823 and 824 for pulling up the potentials at the data lines DOI and $\overline{DOI}$.

The sense detection circuit 83 is formed by inverters 831 and 832 for receiving the potentials at the data lines DOI and $\overline{DOI}$, respectively. The inverters 831 and 832 have a common threshold voltage $V_{th}$ which is, in this case, an operating point. If the potential of the DOI is lower than the operating point $V_{th}$, the inverter 831 generates a sense detection signal N having a high potential. Similarly, if the potential of the DOI is lower than the operating point $V_{th}$, the inverter 832 generates a sense detection signal $\overline{N}$ having a high potential.

The sense end signal generating circuit 84 is formed by delay circuits 841 and 842 connected to the inverters 831 and 832, respectively, a NAND circuit 843 for receiving the sense detection signal N of the inverter 831 and the output of the delay circuit 841, and a NAND circuit 844 for receiving the output potential $\overline{N}$ of the inverter 832 and the output of the delay circuit 842. Also, a NAND circuit 845 is connected to the outputs of the NAND circuits 843 and 845, for generating a sense end signal SE.

The sense activation signal generating circuit 85 generates an internal sense activation signal $\phi_{SI}$. That is, the sense activation signal generating circuit 838 includes an RS flip-flop which is set by a rising edge of the sense activation signal $\phi_S$ and is reset by a rising edge of the sense end signal SE.

The transistors 813 and 814 of the amplifier circuit 81 and the transistors 822, 823 and 824 of the amplifier circuit 82 are controlled by the internal sense activation signal $\phi_{SI}$. In other words, the amplifiers 81 and 82 are turned ON and OFF by the internal sense activation signal $\phi_{SI}$, so that the sense amplifier 8 is called a self-cut type sense amplifier.

The operation of the sense amplifier 8 of FIG. 2 will be explained next with reference to FIG. 3, where a power supply voltage $V_{CC}$ applied to the sense amplifier 8 is high, for examples 2.5 to 5.5 V.

First, at time t1, the sense activation signal $\phi_S$ is changed from low to high. As a result, the internal sense activation signal generating circuit 838 is set, so that the internal sense activation signal $\phi_{SI}$ rises at time t2. Thus, the amplifier circuits 81 and 82 are both activated.

In the amplifier circuit 81, since the current mirror circuits 811 and 812 are cross-coupled, although the potential at one of the data lines such as D remain at a high level, the potential at the other data line such as $\overline{D}$ is gradually decreased. On the other hand, in the amplifier circuit 82, the potential at the data lines DOI and $\overline{DOI}$ are both gradually decreased, but the potential at one of the bit lines such as $\overline{DOI}$ is again increased.

In the sense detection circuit 83, when at least one of the potentials at the data line DOI and $\overline{DOI}$ becomes lower than the operating point $V_{th}$, the NAND circuits 843, 844 and 845 in combination generate a trigger signal SE. That is, in FIG. 3, at time t3, the potential at the data line $\overline{DOI}$ becomes lower than the operating point $V_{th}$, so that the sense detection signal N of the inverter 831 rises. Therefore, at time t4, when a time d corresponding to the delay time of the delay circuit 841 has passed, the sense end signal SE rises to reset the internal sense activation signal generating circuit 85, and accordingly, the internal sense activation signal $\phi_{SI}$ falls to deactivate the amplifiers 81 and 82.

Figure 3:
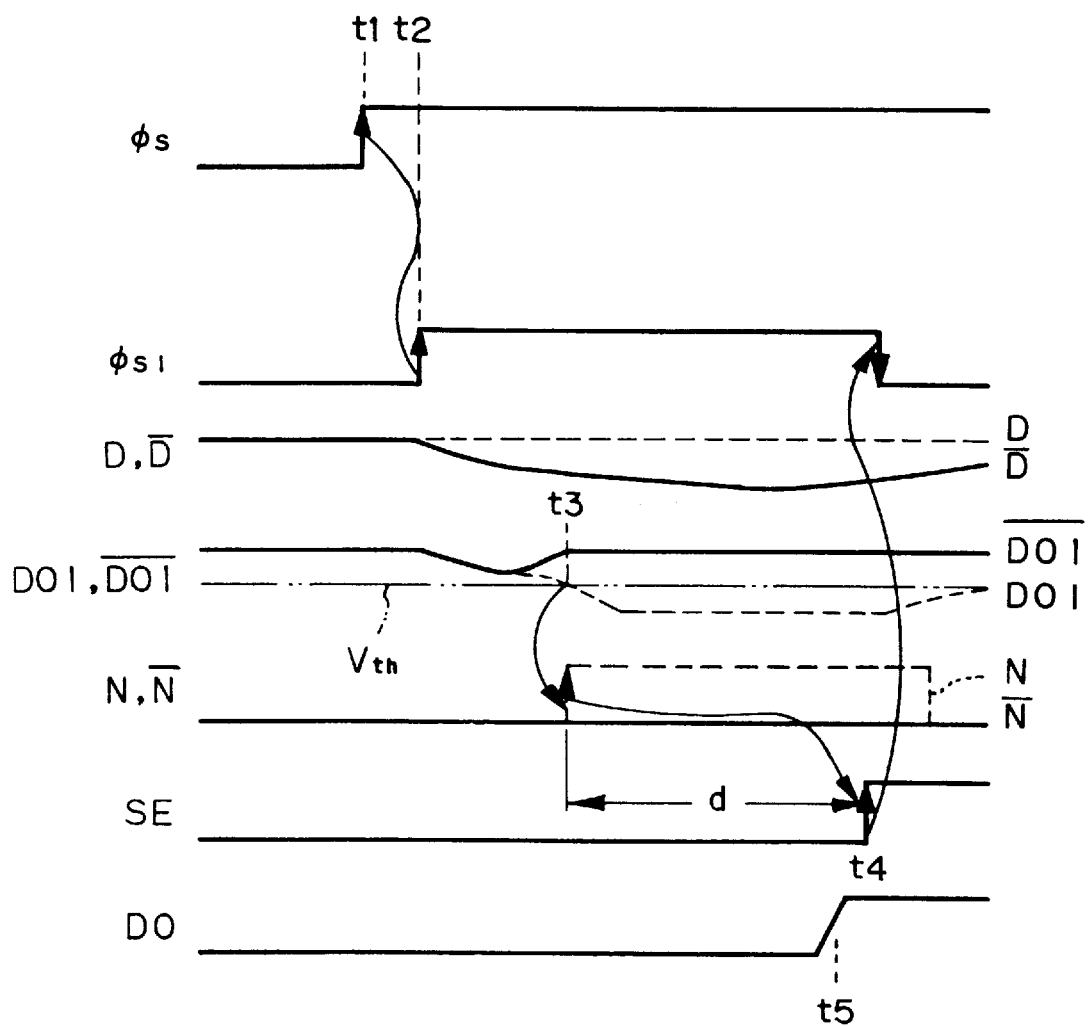
FIGS. 3 and 4 are timing diagrams showing the operation of the sense amplifier of FIG. 2.

In FIG. 3, the output data DO is already established at time t5 early enough before time t4, which causes no problem.

The operation of the sense amplifier 8 of FIG. 2 will be explained next with reference to FIG. 4, where the power supply voltage $V_{CC}$ applied to the sense amplifier 8 is low, for example, 1.5 V.

First, at time t1, the sense activation signal $\phi_S$ is changed from low to high. As a result, the internal sense activation signal generating circuit 85 is set, so that the internal sense activation signal $\phi_{SI}$ rises at time t2. Thus, the amplifier circuits 81 and 82 are both activated.

In the amplifier circuit 81, although the potential at one of the data lines such as D remains at a high level, the potential at the other data line such as $\overline{D}$ is gradually decreased. On the other hand, in the amplifier circuit 82, the potentials at the data lines DOI and $\overline{DOI}$ are both gradually decreased, but the potential at one of the bit lines such as $\overline{DOI}$ is again increased.

In this case, since the power supply voltage $V_{CC}$ is very low, at time t3' earlier than time t3 of FIG. 3 the potentials at the data lines $\overline{DOI}$ and $\overline{DOI}$ both become lower than the operating point $V_{th}$, so that the sense detection signal N of the inverter 831 and the potential at the output $\overline{N}$ of the inverter 832 both rise. Therefore, at time t4' earlier than time t4 of FIG. 3, when a time d corresponding to the delay time of the delay circuit 841 and 842 has passed, the sense end signal SE rises to reset the internal sense activation signal generating circuit 85, and accordingly, the internal sense activation signal $\phi_{SI}$ falls to deactivate the amplifiers 81 and 82.

Figure 4:
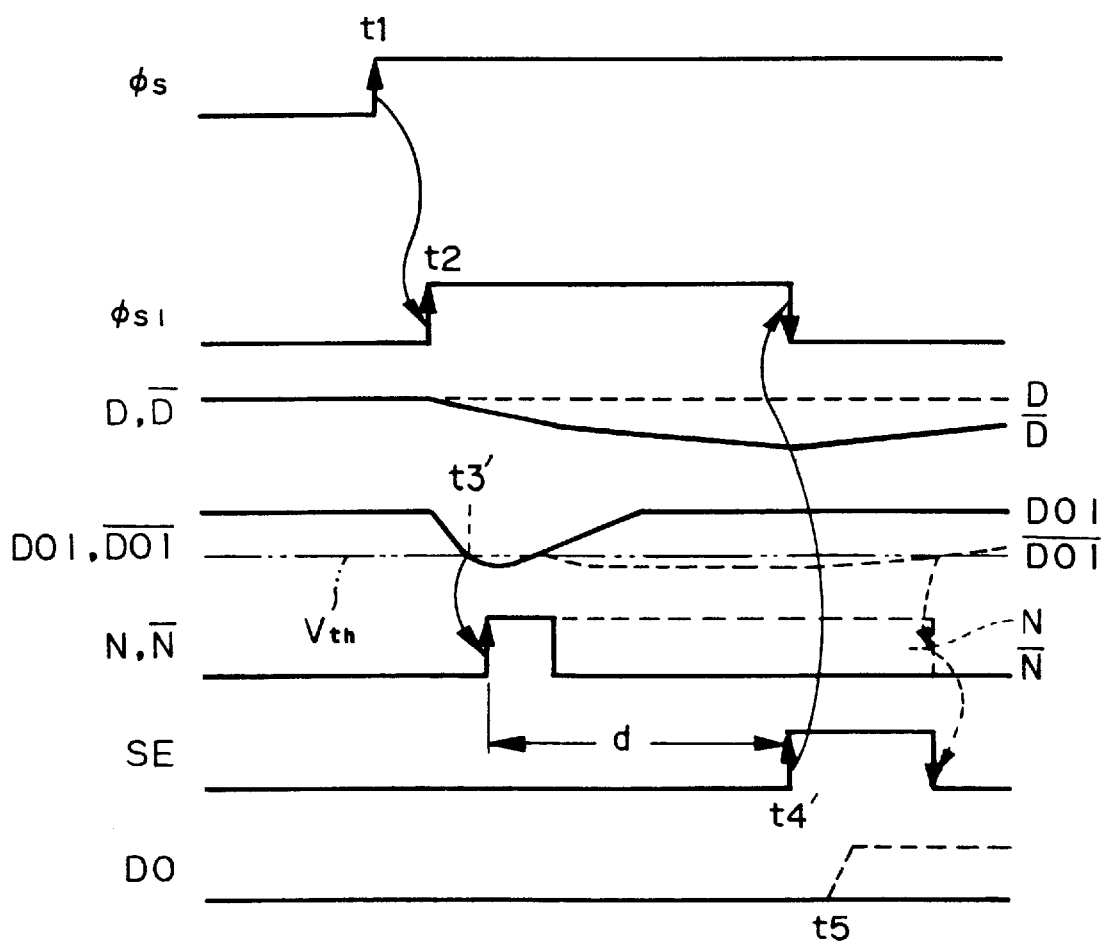

In FIG. 4, however, the output data DO will be established at time t5 late enough after time t4'. Therefore, a normal output data DO cannot be obtained.

Figure 5:
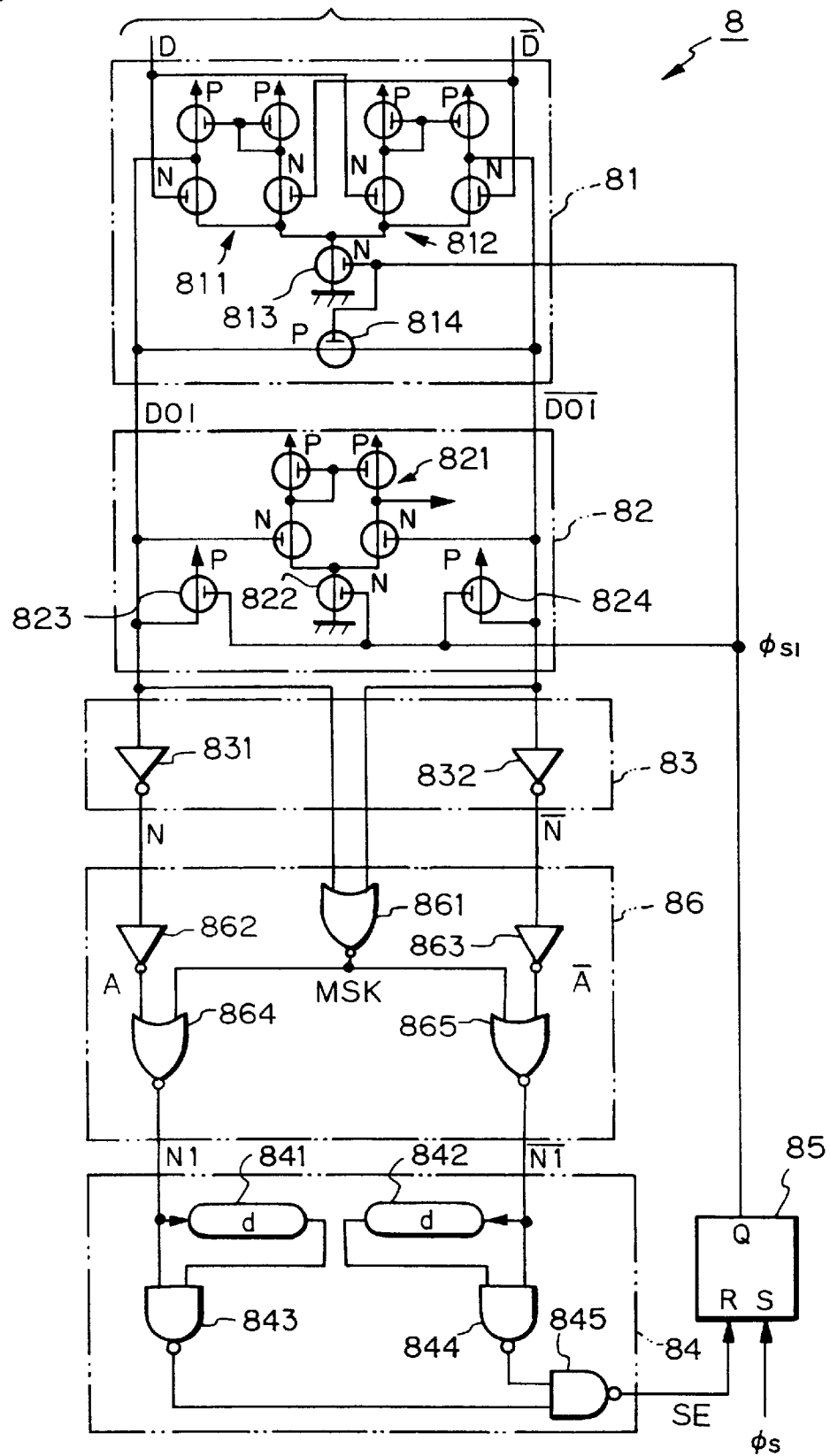
FIG. 5 is a circuit diagram illustrating a first embodiment of the sense amplifier according to the present invention.

If FIG. 5, which illustrates a first embodiment of the present invention, a masking circuit 86 is interposed between the sense detection circuit 83 and the sense and signal generating circuit 84 of FIG. 2. That is, when the inverters 831 and 832 simultaneously generate the sense detection signals N and $\overline{N}$, the masking circuit 86 disables the sense detection signal N and $\overline{N}$, so that the sense end signal generating circuit 84 is not operated.

The masking circuit 86 is formed by a NOR circuit 861 connected to the data lines DOI and $\overline{DOI}$ for generating a mask signal MSK. Note that the NOR circuit 861 has the same operating point $V_{th}$ as that of the inverters 831 and 832. Therefore, only when the potentials at the data lines DOI and $\overline{DOI}$ are both lower than the operating point $V_{th}$, is the mask signal MSK made high. Also, the masking circuit 86 is formed by two inverters 862 and 863 connected to the inverters 831 and 832, a NOR circuit 864 connected to the NOR circuit 861 and the inverter 862, and a NOR circuit 865 connected to the NOR circuit 861 and the inverter 863. In this case, when the mask signal MSK is high, the outputs of the NOR circuits 864 and 865 are both low regardless of the sense detection signals N and $\overline{N}$. Contrary to this, when the mask signal MSK is low, the outputs of the NOR circuits 864 and 865 are the same as those of the inverters 831 and 832, respectively, so that the sense amplifier 8 of FIG. 5 operates in the same way as that of FIG. 2. Therefore, when the power supply voltage applied to the sense amplifier 8 of FIG. 5 is high, since the potentials at the data lines DOI and $\overline{DOI}$ are not lower than the operating point $V_{th}$ simultaneously, the masking circuit 86 is not operated, which also causes no problem.

The operation of the sense amplifier 8 of FIG. 2 will be explained next with reference to FIG. 4, where the power supply voltage $V_{CC}$ applied to the sense amplifier 5 is low, for example, 1.5 V.

First, at time t1, the sense activation signal $\phi_S$ is changed from low to high. As a result, the internal sense activation signal generating circuit 85 is set, so that the internal sense activation signal $\phi_{SI}$ rises at time t2. Thus, the amplifier circuits 81 and 82 are both activated.

In the amplifier circuit 81, although the potential at one of the data lines such as D remains at a high level, the potential at the other data line such as $\overline{D}$ is gradually decreased. On the other hand, in the amplifier circuit 82, the potentials at the data lines DOI and $\overline{DOI}$ are both gradually decreased, but the potential at one of the bit lines such as $\overline{DOI}$ is again increased.

In this case, since the power supply voltage $V_{CC}$ is very low, at time t3, the potentials at the data lines DOI and $\overline{DOI}$ both becomes lower than the operating point $V_{th}$, so that the sense detection signals N and $\overline{N}$ both rise, and accordingly, the potentials A and $\overline{A}$ at the outputs of the inverters 862 and 863 both fall. In this case, since the mask signal MSK simultaneously rises, the potentials N1 and $\overline{N1}$ of the NOR circuits 864 and 865 both remain low regardless of the potentials A and $\overline{A}$.

Next, at time t4, when the potential at the data line DOI becomes higher than the operating point $V_{th}$ while the potential at the data line $\overline{DOI}$ remains lower than the operating point $V_{th}$, the mask signal MSK is made low. In this case, the sense detection signals N and $\overline{N}$ and the outputs A and $\overline{A}$ of the inverters 862 and 863 are also changed.

Therefore, at time t5, when a time d corresponding to the delay time of the delay circuits 841 and 842 has passed, the sense end signal SE rises to reset the internal sense activation signal generating circuit 85, and accordingly, the internal sense activation signal $\phi_{SI}$ falls to deactivate the amplifiers 81 and 82.

Figure 6:
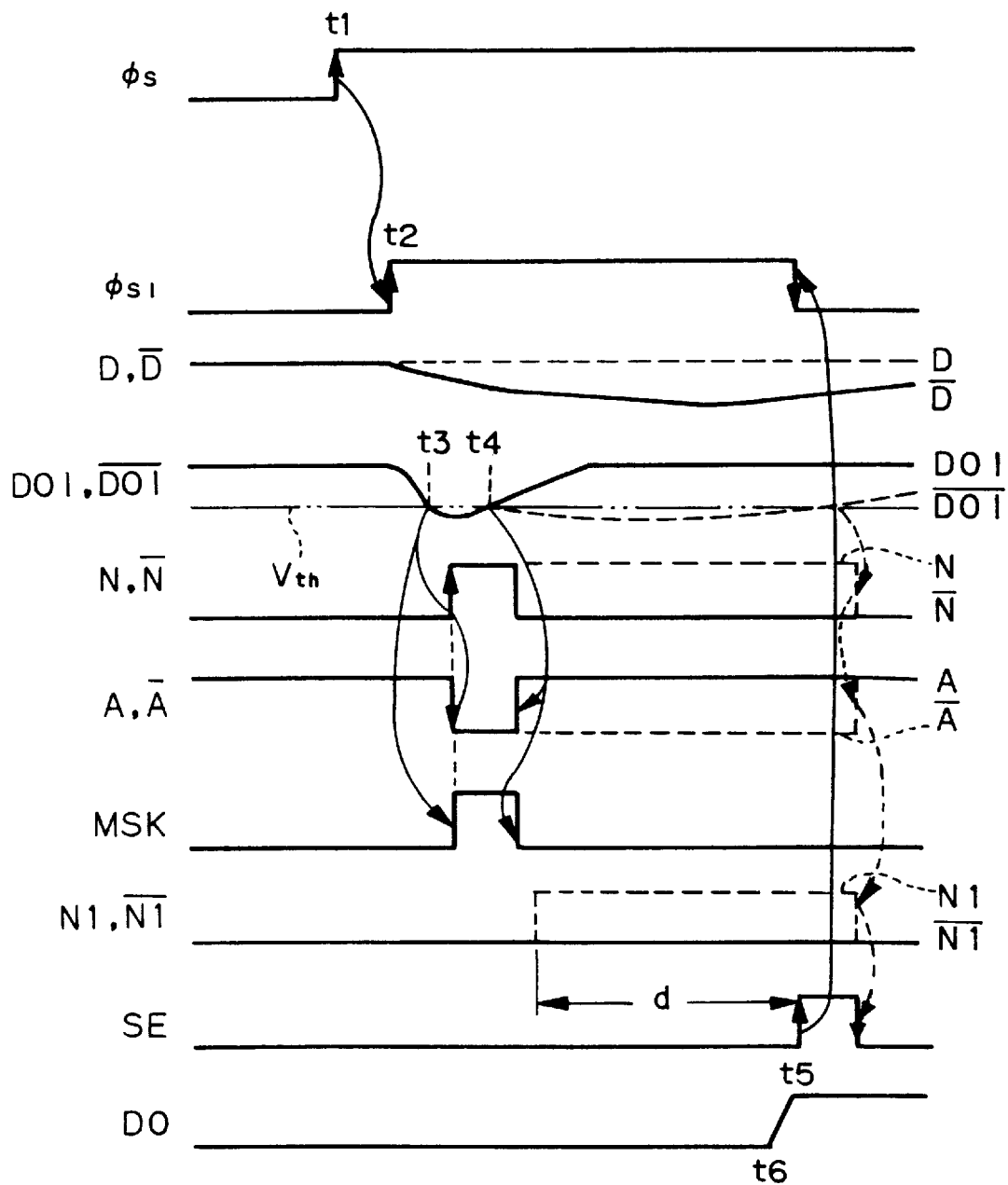
FIG. 6 is a timing diagram showing the operation of the sense amplifier of FIG. 6.

Even in FIG. 6, the output data DO is already . established at time t6 early enough before time t5, which also causes no problem.

Note that the above-mentioned delay time of the delay circuits 841 and 842 is about 1 to 2 ns.

Thus, in the first embodiment, when the power supply voltage $V_{CC}$ is low, even if detection signals N and $\overline{N}$ are both generated, a mask signal MSK is generated to delay the generation of a sense end signal SE. Thus, the timing of generation of the output data DO can be sufficiently before that of the sense end signal SE, thus making the output data DO normal.

Figure 7:
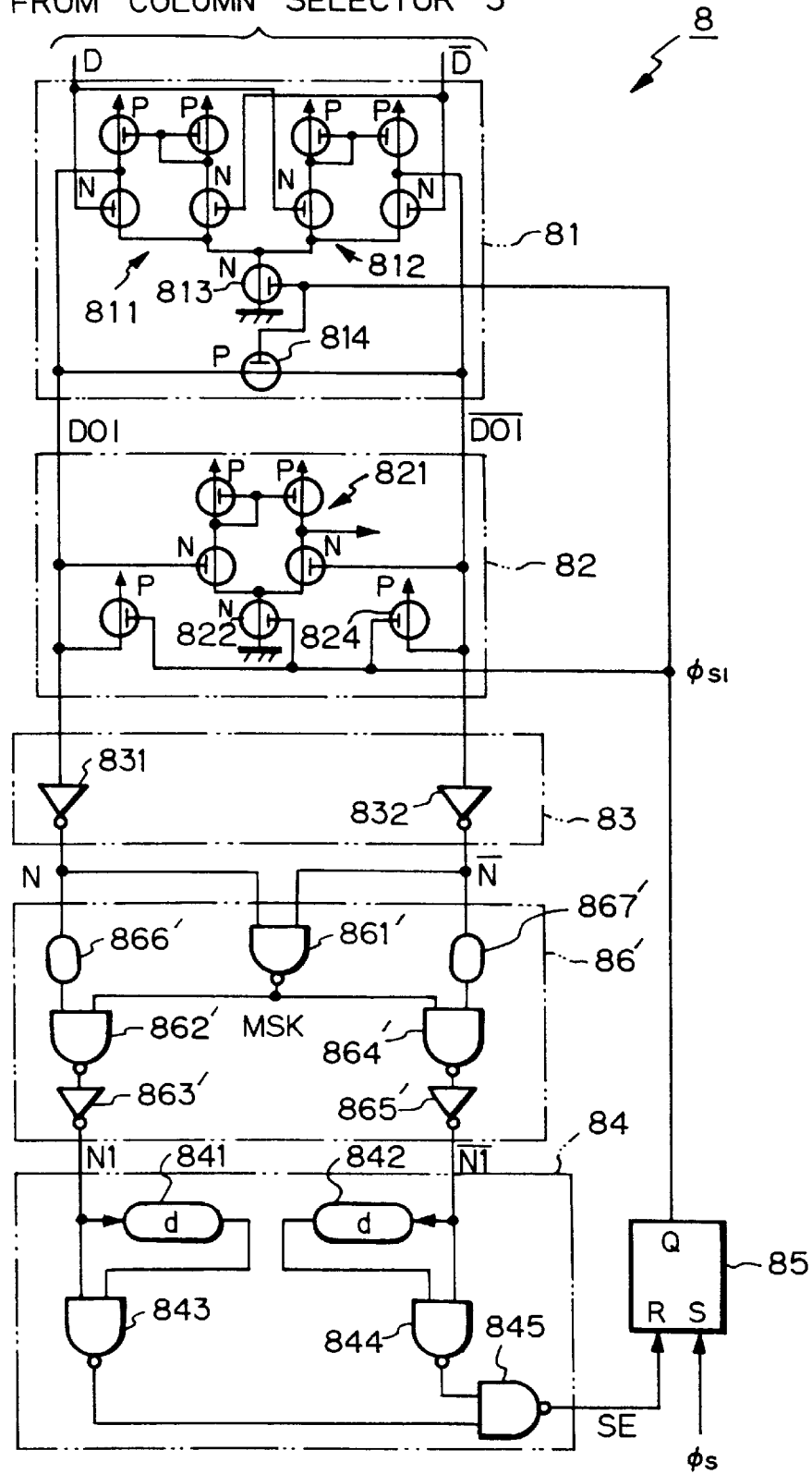
FIG. 7 is a circuit diagram illustrating a second embodiment of the sense amplifier according to the present invention.

In FIG. 7, which illustrates a second embodiment of the present invention, the masking circuit 86 of FIG. 5 is modified into a masking circuit 86'. The masking circuit 86' is formed by a NAND circuit 861', a NAND circuit 862' and an inverter 863' serving as an AND circuit, a NAND circuit 864' and an inverter 865' serving as an AND circuit, and delay circuits 866' and 867'. NOte that the delay circuits 866' and 867' have a delay time which is approximately the same as the operation time of the NAND circuit 861'. Even in FIG. 7, when the sense detection signals N and N are both high, the NAND circuit 861' generates a mask signal KSK, so that the outputs N1 and $\overline{N1}$ of the inverters 863' and 865' are made low regardless of the sense detection signals N and $\overline{N}$. Thus the sense amplifier 8 of FIG. 7 operates in the same way as the sense amplifier 8 of FIG. 5.

Figure 8:
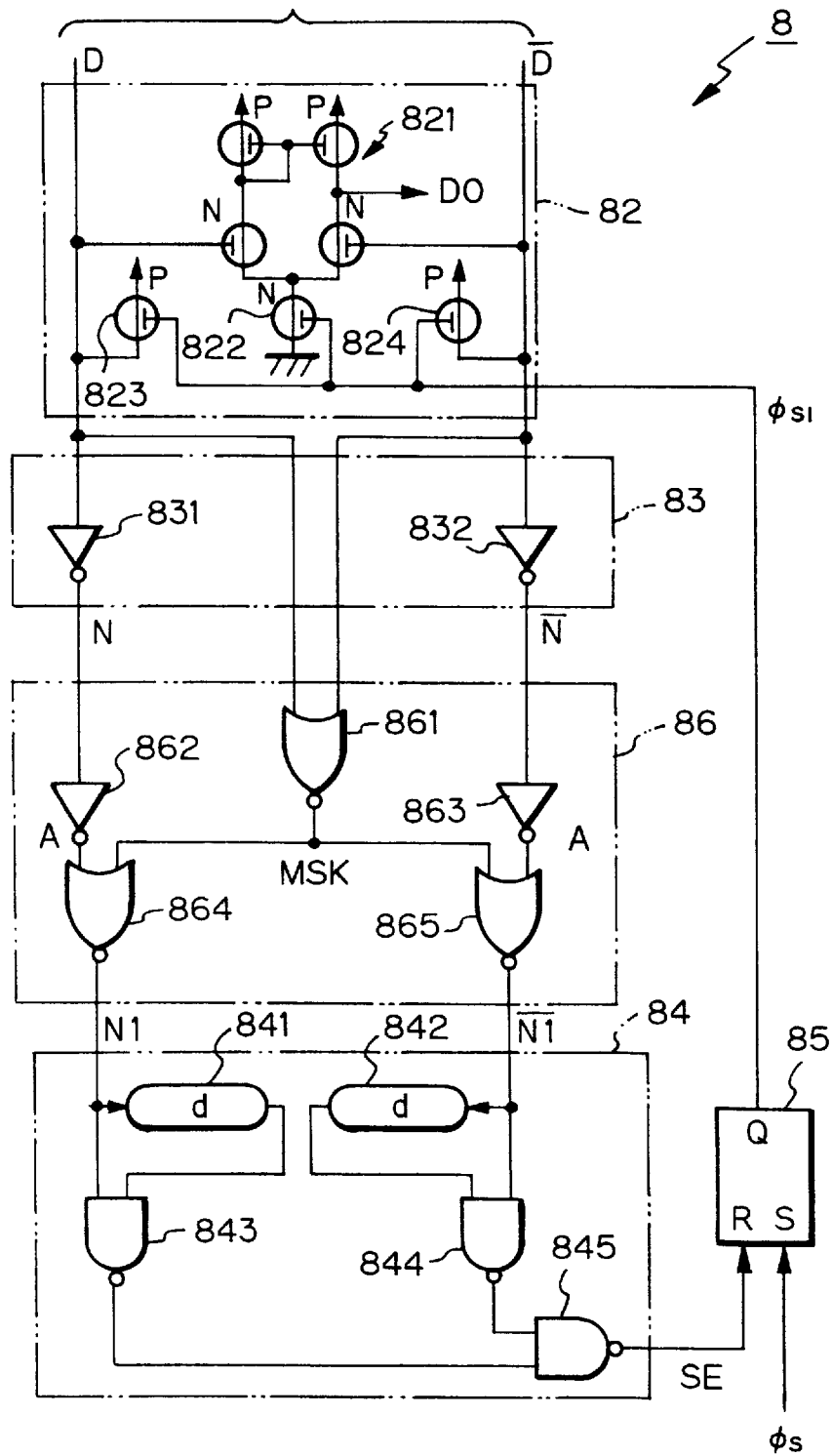
FIG. 8 is a circuit diagram illustrating a modification of the sense amplifier of FIG. 5.

Note that the present invention can be applied to a sense amplifier including a single differential amplifier as illustrated in FIG. 8, where the amplifier 82 is connected directly to the data lines DO and $\overline{DO}$.

As explained hereinabove, according to the present invention, even when the power supply voltage is changed, the timing of an output data can be sufficiently before the cut off timing of the sense amplifier. Thus, normal output data can be obtained.

I claim:

1. A sense amplifier for sensing a difference in potential between first and second data lines, comprising:

an amplifier circuit for amplifying said difference in potential, said amplifier circuit generating first and second output voltages;

an amplifier circuit activating circuit, connected to said amplifier circuit, for receiving a sense start signal to activate said amplifier circuit and receiving a sense end signal to deactivate said amplifier circuit;

a first sense detecting circuit, connected to said amplifier circuit, for determining whether or not said amplifier circuit is activated in accordance with said first output voltage and generating a first sense detection signal;

a second sense detecting circuit, connected to said amplifier circuit, for determining whether or not said amplifier circuit is activated in accordance with said second output voltage and generating a second sense detection signal;

a sense end signal generating circuit, connected to said amplifier circuit activating circuit, for receiving at least one of said first and second sense detection signals and generating said sense end signal when a predetermined time has passed after said at least one of said first and second sense detection signals is received; and a masking circuit, connected between said first and second sense detecting circuits and said sense end signal generating circuit, for prohibiting transmission of said first and second sense detection signals to said sense end signal generating circuit only when said first and second sense detection signals are both generated.

2. The sense amplifier as set forth in claim 1, wherein said masking circuit comprises:

a NAND circuit, connected to said first and second sense detecting circuits, for generating a mask signal;

first and second delay circuits connected to said first and second sense detection circuits, respectively and having a delay time which is about the same as an operation time of said first NAND circuit;

a first AND circuit, connected to said NAND circuit and said first delay circuit, for transmitting said first sense detection signal to said sense end signal generating circuit in accordance with said mask signal; and a second AND circuit, connected to said NAND circuit and said second delay circuit, for transmitting said second sense detection signal to said sense end signal generating circuit in accordance with said mask signal.

3. The sense amplifier as set forth in claim 1, wherein said masking circuit is further connected to said amplifier circuit.

4. The sense amplifier as set forth in claim 3, wherein said masking circuit comprises:

a first NOR circuit, connected to said amplifier circuit, for receiving said first and second output voltages and generating a mask signal;

a first inverter connected to said first sense detecting circuit;

a second inverter connected to said second sense detecting circuit;

a second NOR circuit, connected to said first NOR circuit and said first inverter, for transmitting said first sense detection signal to said sense end signal generating circuit in accordance with said mask signal; and a third NOR circuit, connected to said first NOR circuit and said second inverter, for transmitting said second sense detection signal to said sense end signal generating circuit in accordance with said mask signal.

5. The sense amplifier as set forth in claim 1, wherein said amplifier circuit comprises:

a first stage differential amplifier for amplifying said difference in potential and generating said first and second output voltages; and a second stage differential amplifier, connected to said first differential amplifier, for generating a difference between said first and second output voltages.

6. The sense amplifier as set forth in claim 1, wherein said amplifier circuit comprises:

a single stage differential amplifier for amplifying said difference in potential and generate said first and second output voltages.

7. The sense amplifier as set forth in claim 1, wherein each of said first and second sense detecting circuits comprises an inverter.

* * * * *